US008093655B2

(12) United States Patent
Hirler et al.

(10) Patent No.: US 8,093,655 B2
(45) Date of Patent: Jan. 10, 2012

(54) INTEGRATED CIRCUIT INCLUDING A TRENCH TRANSISTOR HAVING TWO CONTROL ELECTRODES

(75) Inventors: Franz Hirler, Isen (DE); Maximilian Roesch, Villach-St. Magdalen (AT); Ralf Siemieniec, Villach (AT)

(73) Assignee: Infineon Technologies Austria AG, Villach (AT)

( * ) Notice: Subject to any disclaimer, the term of this patent is extended or adjusted under 35 U.S.C. 154(b) by 178 days.

(21) Appl. No.: 11/760,275

(22) Filed: Jun. 8, 2007

(65) Prior Publication Data
US 2007/0296029 A1 Dec. 27, 2007

(30) Foreign Application Priority Data

Jun. 9, 2006 (DE) .................. 10 2006 026 943

(51) Int. Cl.
*H01L 29/78* (2006.01)
*H01L 27/00* (2006.01)
(52) U.S. Cl. ........ 257/341; 257/330; 257/331; 257/332; 257/E29.257; 257/E29.201
(58) Field of Classification Search .................. 257/302, 257/329, 330, 331, 334, 307, 500, 328, 374, 257/77, E29.2, E29.201, E29.257, E29.262, 257/E29.264, E29.267, 202, 250, 249, 332, 257/E29.028, 341, E29.067; 438/259, 270; 365/149
See application file for complete search history.

(56) References Cited

U.S. PATENT DOCUMENTS

| 5,998,833 | A | 12/1999 | Baliga | |
|---|---|---|---|---|
| 6,677,641 | B2 * | 1/2004 | Kocon | 257/329 |
| 7,005,351 | B2 | 2/2006 | Henninger et al. | |
| 2002/0030237 | A1* | 3/2002 | Omura et al. | 257/397 |
| 2003/0073287 | A1* | 4/2003 | Kocon | 438/259 |
| 2003/0222297 | A1* | 12/2003 | Krumrey et al. | 257/302 |
| 2004/0089910 | A1 | 5/2004 | Hirler et al. | |
| 2004/0155287 | A1 | 8/2004 | Omura et al. | |
| 2005/0173758 | A1 | 8/2005 | Peake et al. | |
| 2006/0017056 | A1* | 1/2006 | Hirler | 257/77 |
| 2006/0231917 | A1* | 10/2006 | Ono et al. | 257/500 |

FOREIGN PATENT DOCUMENTS

| DE | 100 38 177 | | 2/2002 |
|---|---|---|---|
| DE | 102 12 149 | | 10/2003 |
| DE | 103 39 455 | | 4/2005 |
| DE | 103 41 592 A1 | | 7/2005 |
| EP | 1168455 | * | 2/2002 |
| EP | 1 170 803 A2 | | 9/2002 |
| EP | 1 589 585 | | 10/2005 |
| WO | 2005/053032 A2 | | 6/2005 |
| WO | 2005065385 | | 7/2005 |

* cited by examiner

*Primary Examiner* — Colleen Matthews
*Assistant Examiner* — Galina Yushina
(74) *Attorney, Agent, or Firm* — Dicke, Billig & Czaja, PLLC

(57) ABSTRACT

An integrated circuit including a field effect controllable trench transistor having two-control electrodes is disclosed. One embodiment provides a trench having a first control electrode and a second control electrode. A first electrical line is provided in an edge structure for electrically contact-connecting second control electrode.

10 Claims, 5 Drawing Sheets

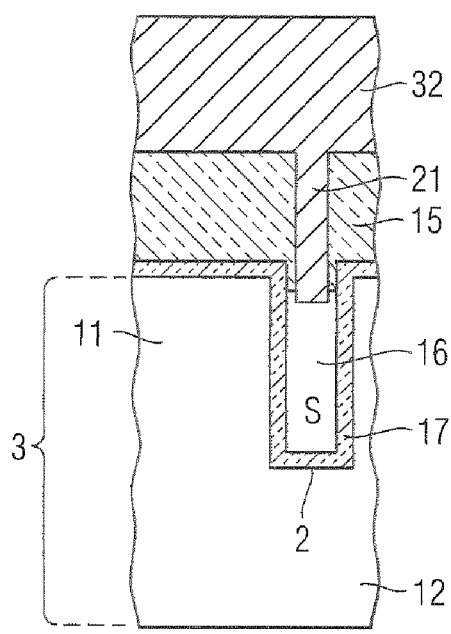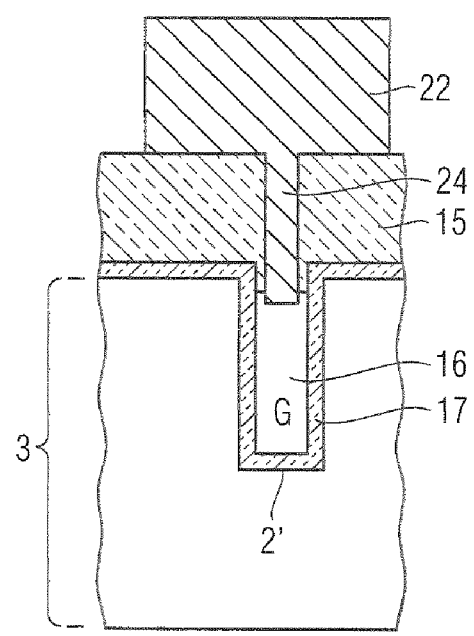

I - I

II - II

III - III

INTEGRATED CIRCUIT INCLUDING A TRENCH TRANSISTOR HAVING TWO CONTROL ELECTRODES

CROSS-REFERENCE TO RELATED APPLICATIONS

This Utility Patent Application claims priority to German Patent Application No. DE 10 2006 026 943.8 filed on Jun. 9, 2006, which is incorporated herein by reference.

BACKGROUND

The present invention lies in the field of semiconductor technology and relates to an integrated circuit having a field effect controllable trench transistor (FET) having two control electrodes.

Conventional field-effect transistors include a first connection electrode (e.g., source electrode) connected to a first connection zone (e.g., source connection zone) of a semiconductor body, and a second connection electrode (e.g., drain electrode) connected to a second connection zone (e.g., drain connection zone) of the semiconductor body. Furthermore, a control electrode ("gate electrode") insulated from the semiconductor body is provided for controlling a conductive channel between these two electrodes, the control electrode being connected or being able to be connected to a control potential ("gate potential"). In the case of a trench transistor, the control electrode extends in a trench into the semiconductor body. A gate insulation layer serves for insulating the gate electrode from the semiconductor body.

A channel zone ("body zone") doped complementarily with respect to the drain and source connection zones can be arranged between the two connection zones in order to make the FET normally off. In this case, the gate electrode is arranged adjacent to the body zone in order to produce a conductive channel ("inversion channel") in the body zone upon application of a control potential having a suitable sign, thereby enabling a current flow in the semiconductor body when voltage is applied between the source electrode and the drain electrode. In the case of a normally on FET, a complementarily doped body zone is not provided, the control electrode in this case serving to pinch off a conductive channel through application of a control potential having a suitable sign in order to interrupt a current flow in the semiconductor body when a supply voltage is applied to drain electrode and source electrode.

For the practical application of field effect transistors, endeavors are made to ensure that they have a high breakdown voltage (dielectric strength) and at the same time a low on resistance. In this case, the breakdown voltage is defined as that supply voltage at which a normally off FET undergoes transition to breakdown with the gate electrode not being driven. With the gate electrode being driven, the on resistance can be determined computationally as the quotient of the applied supply voltage and the source-drain current that occurs at this voltage.

Furthermore, for practical application endeavors are made to ensure that the field effect transistors have a minimum parasitic capacitance between the gate electrode and the drain electrode since the switching losses, particularly at high switching frequencies, are increased thereby in a disadvantageous manner. Fast switching edges advantageously enable for example, the operation of a DC/DC converter at higher switching frequencies, so that the efficiency can be increased and the system outlay can be reduced overall. In the case of trench transistors, the parasitic capacitance between the gate electrode and the drain electrode in particular also increases with an increasing overlap region of gate electrodes and drain zone.

As a measure for increasing the breakdown voltage, it is known for example, to provide a thicker gate insulation layer between the gate electrode and semiconductor body, but this increases the on resistance in a disadvantageous manner. Furthermore, for this purpose it is known to provide an epitaxial zone (drift zone) doped more weakly than the drain connection zone between the body zone and the drain connection zone, but this increases the on resistance in a disadvantageous manner. The drain connection zone and the more weakly doped drift zone can be combined under the term "drain zone".

In order to realize a maximum breakdown voltage in conjunction with a low on resistance and a low parasitic capacitance between gate electrode and drain electrode and hence low switching losses, in trench transistors the use of a further control electrode ("field electrode") arranged adjacent to the gate electrode in the trench has been proposed, the further control electrode being insulated from the semiconductor body and being able to be connected to a field electrode potential. In this case, the field electrode preferably extends through the majority of the drift zone. A field electrode insulation layer serves for insulating the field electrode from the semiconductor body, and is advantageously thicker than the gate insulation layer.

In such trench transistors having two control electrodes, when the supply voltage is present the field electrode reduces a field strength acting at the gate insulation layer of the gate electrode. In this way, relative to comparable field effect transistors without such a field electrode given the same dielectric strength, the doping of the drift zone can be increased, whereby the on resistance and the parasitic capacitance between the gate electrode and the drain electrode can advantageously be reduced. In this case, in particular the potential present at the source electrode is applied to the field electrode.

In the case of such trench transistors having a gate electrode and an additional field electrode connected to source potential, it is possible, in principle, to set the parasitic capacitance between the gate electrode and the drain electrode (that is to say the gate-drain charge) by using the position of the lower edge of the gate electrode in relation to the pn junction, that is to say the junction from the body zone into the drain zone (drift zone). In this case, it is particularly advantageous if, as viewed in the direction of the trench depth, the lower edge of the gate electrode is situated as precisely as possible at the level of the pn junction, because this makes it possible to achieve a minimum parasitic capacitance between the gate electrode and the drain electrode.

Furthermore, U.S. Pat. No. 4,941,026 discloses, instead of two separate control electrodes, the formation of a gate electrode that extends right into the drift zone and is surrounded by a thin-thick oxide. One advantage of such a gate electrode is primarily a relatively low on resistance on account of the formation of an accumulation channel, the on resistance being reduced by approximately 10 to 30% relative to transistors having a gate electrode that does not extend right into the drift zone. One disadvantage, however, is the accompanying higher parasitic capacitance between the gate electrode and the drain electrode, the parasitic capacitance being increased by approximately 50 to 300% relative to transistors having a gate electrode that does not extend right into the drift zone. Moreover, preceding from a process for forming a transistor including separate gate and field electrodes, a high development outlay is necessary since, by way of example, after the etching of the field oxide at the upper trench sidewalls and during the growth of the gate oxide, an oxide layer is formed on the field electrode and insulates the latter from the gate potential. Subsequent processes for selectively removing the oxide layer on the field electrode contaminate or thin the gate oxide and lead to reliability problems.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
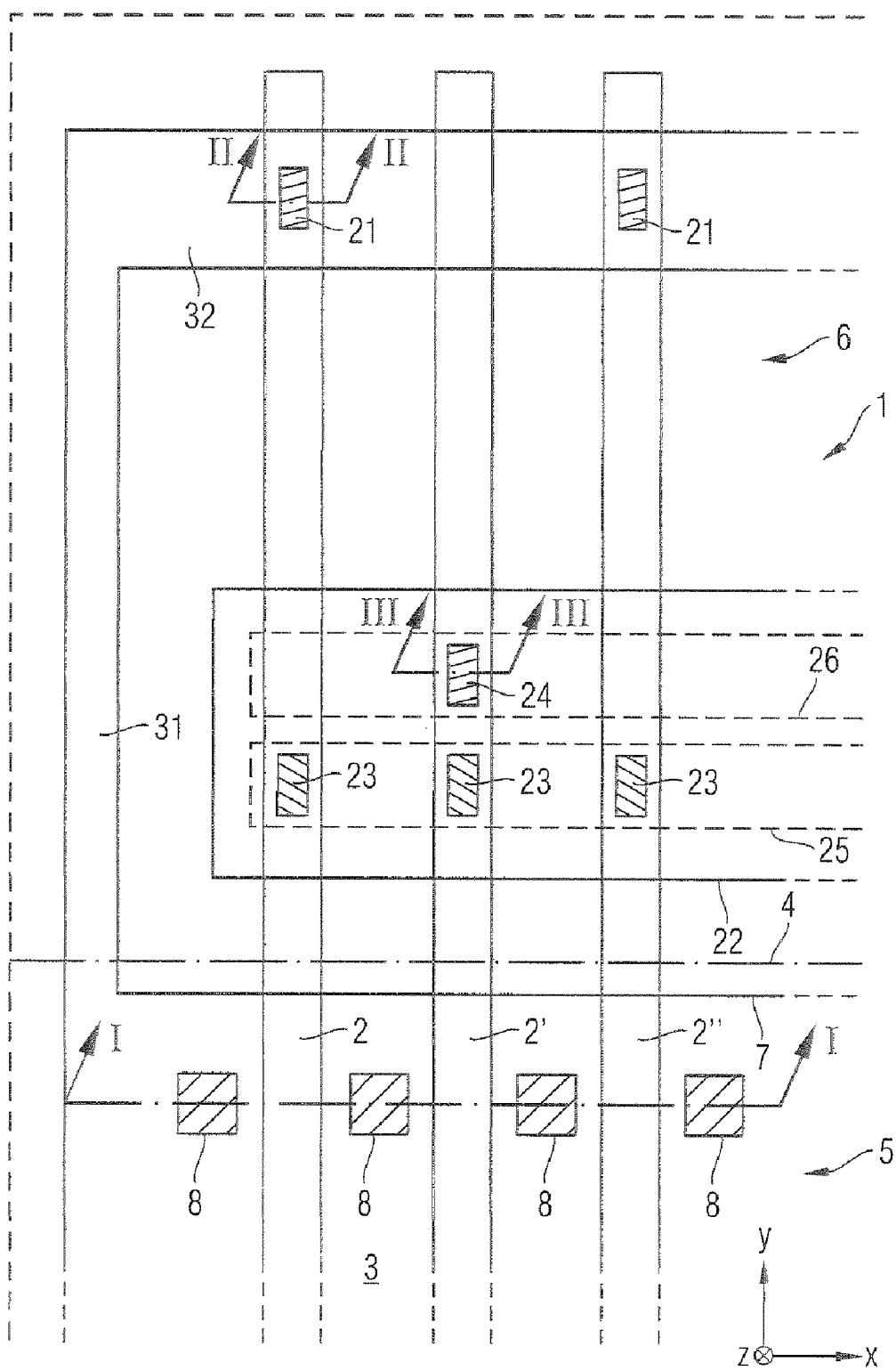
FIG. 1 illustrates a schematic plan view of a trench transistor.

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One or more embodiments provide an integrated circuit having a field effect controllable trench transistor having two control electrodes in one and the same trench, in one embodiment, a gate electrode and field electrode, which enables a simple setting of the on resistance and the parasitic capacitance between gate electrode and drain electrode and can be produced in a technically simple manner.

One or more embodiments provide an integrated circuit having a field effect controllable trench transistor including a semiconductor body, which can be subdivided into a cell array region having at least one cell array and into an edge structure framing the at least one cell array. If the cell array region contains a plurality of cell arrays, then the latter can be separated from one another for example, by gate fingers (gate leads). In this case, all of the separating sections (e.g., the above gate fingers) and all of the regions of the semiconductor body which are not provided with electrically active channels are assigned to the edge structure. Each cell array by itself is framed by the edge structure. All the sections of the semiconductor body in which current flows through the semiconductor body in the switched-on state of the transistor are assigned to the cell array region.

In one embodiment, the semiconductor body of the trench transistor is provided with at least one doped first connection zone and at least one doped second connection zone in the cell array region. A first connection electrode is connected to the first connection zone, a first supply potential being able to be applied to the first connection electrode, and a second connection electrode is connected to the second connection zone, a second supply potential being able to be applied to the second connection electrode.

Furthermore, the trench transistor includes at least one trench formed in the semiconductor body, the trench being able to extend, in particular, from the cell array right into the edge structure. A first control electrode ("gate electrode") is formed in the trench, the first control electrode being insulated from the semiconductor body by a first insulation layer and being able to be connected to a first control potential. Furthermore, a second control electrode (field electrode) is arranged in the same trench, adjacent to the first control electrode, the second control electrode being arranged in the semiconductor body in a manner insulated by a second insulation layer and being able to be connected to a second control potential. In this case, the second control electrode can extend right into the edge structure if the trench extends right into the edge structure.

Furthermore, the trench transistor includes, in its edge structure, a first electrical line—which can be connected to the second control potential—for electrically contact-connecting at least one of the second control electrodes. In this case, a second control electrode can be contact-connected for example, by using an electrical contact formed in a contact hole between the first electrical line and the second control electrode. This presupposes that the second control electrode extends right into the edge structure. As an alternative, it is possible for an electrical contact connected to the second control electrode to be led outside the trench into the edge structure and be contact-connected there by the first electrical line.

The first electrical line can contact-connect only a portion or all of the field electrodes in the edge structure. If the first electrical line contact-connects only a portion of the field electrodes in the edge structure, then this can have the effect that not all of the field electrodes are connected to an identical second control potential. If, on the other hand, the first electrical line contact-connects all of the field electrodes in the edge structure, then this has the effect that all of the field electrodes are connected to an identical second control potential.

By way of example, in the last-mentioned case, all of the field electrodes can be connected to a control potential that is identical to the first control potential of the gate electrodes. With this embodiment, a minimum on resistance can be achieved on account of an accumulation channel below the conductive inversion channel produced by the gate electrode.

In one embodiment of the trench transistor, in which not all of the field electrodes are contact-connected by the first electrical line in the edge structure, the first connection electrode in the cell array serves for contact-connecting at least one of the field electrodes in the cell array, the field electrode not being contact-connected by the first electrical line in the edge structure. In general, this has the effect that the field electrodes which are connected to the first electrical line are connected or can be connected to a different second control potential than those field electrodes which are connected to the first connection electrode. In other words, the potential value of the second control potential of the field electrodes connected to the first electrical line and the potential value of the second control potential of the field electrodes connected to the first connection electrode are different from one another. Consequently, the second control potentials of different field electrodes can have potential values which are different from one another.

In one embodiment of the trench transistor, field electrodes are contact-connected by the first connection electrode in the cell array and by the first electrical line in the edge structure in a lateral direction perpendicular to the extension direction of the trenches with a (selectable) contact-connection scheme that is repeated substantially periodically in this direction. By way of example, in this direction directly adjacent field electrodes can be contact-connected alternately either by the first electrical line or the first connection electrode, such that the contact-connection scheme that is repeated periodically in this direction is composed of a field electrode connected to the first electrical line and a field electrode connected to the first connection electrode. As an alternative, by way of example, in each case two adjacent field electrodes can be connected to the first electrical line, followed by a field electrode contact-connected to the first connection electrode, such that the contact-connection scheme that is repeated periodically in this direction is composed of two field electrodes connected to the first electrical line and one field electrode connected to the first connection electrode. Arbitrary combinations of contact-connections of field electrodes to the first electrical line and the first connection electrode are possible in an analogous manner in the contact-connection scheme according to the invention.

In another embodiment of the trench transistor, in which not all of the field electrodes are contact-connected by the first electrical line in the edge structure, a second electrical line is provided in the edge structure for electrically contact-connecting at least one field electrode, the field electrode not being contact-connected by the first electrical line. In this case, a second control electrode can be contact-connected for example, by using an electrical contact formed in a contact hole between the second electrical line and the second control electrode. This presupposes that the second control electrode extends right into the edge structure. As an alternative, it is possible for an electrical contact connected to the second control electrode to be led outside the trench into the edge structure and be contact-connected there by the second electrical line.

In one embodiment of the trench transistor, the field electrodes are contact-connected by the first electrical line and by the second electrical line in the edge structure in a lateral direction perpendicular to the extension direction of the trenches with a (selectable) contact-connection scheme that is repeated substantially periodically in this direction. By way of example, in this direction directly adjacent field electrodes can be contact-connected alternately either by the first electrical line or the second electrical line, such that the contact-connection scheme that is repeated periodically in this direction is composed of a field electrode connected to the first electrical line and a field electrode connected to the second electrical line. As an alternative, by way of example, in each case two adjacent field electrodes can be connected to the first electrical line, followed by a field electrode contact-connected to the second electrical line, such that the contact-connection scheme that is repeated periodically in this direction is composed of two field electrodes connected to the first electrical line and one field electrode connected to the second electrical line. Arbitrary combinations of contact-connections of field electrodes to the first electrical line and the second electrical line are possible in an analogous manner in the contact-connection scheme according to the invention.

In one embodiments of the trench transistor, the second electrical line is electrically conductively connected to the first connection electrode (source electrode).

In one or more embodiment of the trench transistor, the first electrical line in the edge structure (also) serves for contact-connecting the first control electrodes. In this case, the field electrodes contact-connected by the first electrical line and the gate electrodes are connected or can be connected to an identical control potential. In other words, first and second control potential are identical in the case of the field electrodes connected to the first electrical line and the gate electrodes. If all the field electrodes and all the gate electrodes are connected to the first electrical line, all the field electrodes and all the gate electrodes are connected or can be connected to an identical control potential (gate potential).

In one or more embodiments of the trench transistor, field electrodes are contact-connected by using the first electrical line and/or the second electrical line in the edge structure in each case through an electrical contact formed in a contact hole.

Consequently, in the case of the trench transistor, a contact-connection of field electrodes in the cell array, the contact-connection requiring a complicated development process, can advantageously be dispensed with. Moreover, the contact-connection of field electrodes to a first electrical line and the first connection electrode or a first electrical line and a second electrical line permits the application of different second control potentials (to put it another way, a second control potential having different potential values) to the field electrodes.

If a field electrode is connected for example, to a second control potential that is identical to the first control potential of the gate electrodes, then this has the effect that the on resistance of the trench transistor is decreased, while at the same time the parasitic capacitance between gate electrode and drain electrode rises. If a field electrode is connected for example, to a second control potential that is identical to the first supply potential (source potential), then this conversely has the effect that the on resistance of the trench transistor rises, while at the same time the parasitic capacitance between gate electrode and drain electrode is reduced.

If all the field electrodes are connected to the gate potential, then the on resistance of the trench transistor assumes a minimal value, while the parasitic capacitance between gate electrode and drain electrode assumes a maximal value. If, by contrast, all the field electrodes are connected to the source potential, then the on resistance assumes a maximal value, while the parasitic capacitance between gate electrode and drain electrode assumes a minimal value. If the field electrodes are then connected to the gate potential and the source potential in an alternate sequence in a lateral direction, by way of example, then the on resistance and the parasitic capacitance between gate electrode and drain electrode assume values that lie in the middle between their respective minimal and maximal values. In a corresponding manner, by using a selectable sequence of contact-connections in a lateral direction perpendicular to the extension direction of the trenches and corresponding application of different second control potentials (different potential values of the second control potential), it is possible to set arbitrary relative ratios of on resistance and parasitic capacitance between gate electrode and drain electrode in the trench transistor.

Figure 2A:
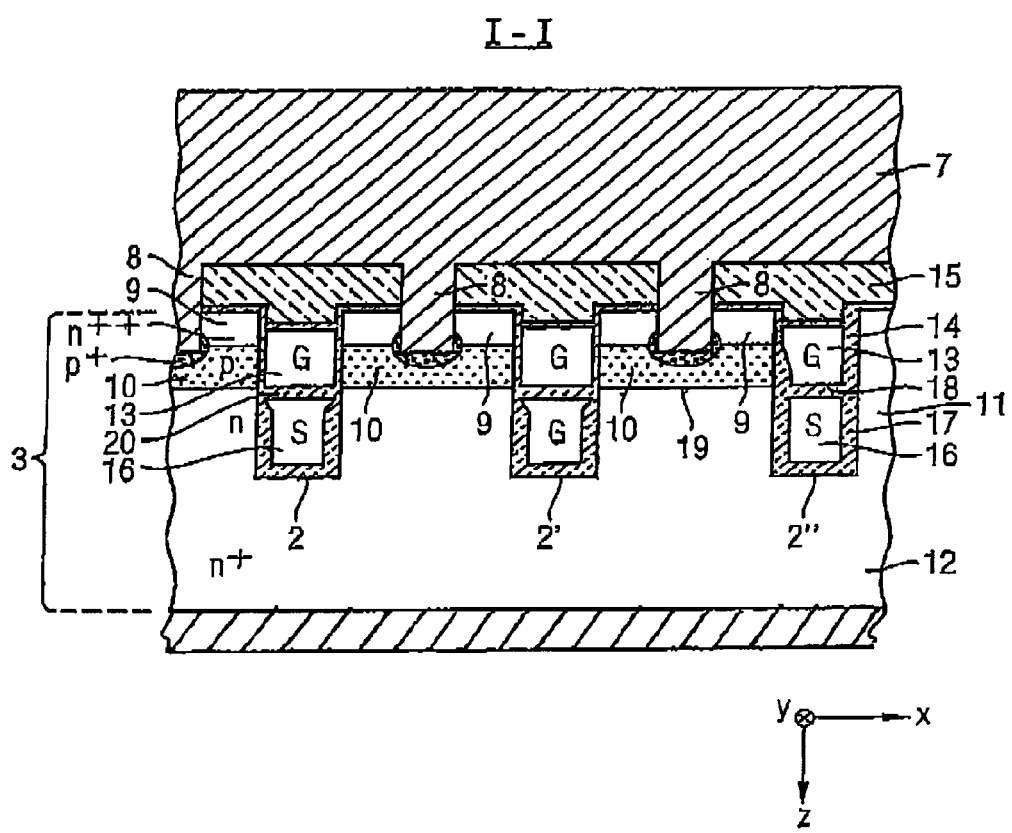
FIG. 2 illustrates schematic lateral sectional illustrations in accordance with the sectional lines I-I, II-II and III-III from FIG. 1 of a first embodiment of the trench transistor.

Reference will now be made to FIG. 1 and also FIGS. 2A, 2B and 2C, which illustrate a schematic plan view of an integrated circuit having a trench transistor and respective lateral sectional views of the trench transistor. In this case, FIG. 2A illustrates a lateral sectional view in accordance with the sectional line I-I from FIG. 1, FIG. 2B illustrates a lateral sectional view in accordance with the sectional line II-II from FIG. 1 and FIG. 2C illustrates a lateral sectional view in accordance with the sectional line III-III from FIG. 1.

Accordingly, a trench transistor, which is designated in its entirety by the reference numeral 1, includes a plurality of trenches 2, 2', 2" formed in a semiconductor body 3. The trenches 2, 2', 2" extend parallel to one another from a cell array 5, which is situated below a dash-dotted line 4 in FIG. 1, as far as an edge structure 6 of the trench transistor 1, the edge structure being situated above the dash-dotted line 4. Only three trenches 2, 2', 2" are presented in FIG. 1 for illustration purposes. For the sake of completeness, it should be pointed out that a trench transistor can have more or fewer than three trenches 2, 2', 2".

In the trench transistor 1, a source metallization 7 serves for electrically contact-connecting source connection zones 9, which are heavily n-doped ($n^{++}$) in the example illustrated. The contact-connection is effected by using electrical contacts 8 of the source metallization 7 that are formed in contact holes.

Furthermore, the trench transistor 1 includes a heavily n-doped ($n^{TM}$) drain connection zone 12 as part of a drain zone, to which a drain electrode (not illustrated in the figures) is connected. In the drain zone, a more weakly n-doped (n) drift zone 11 is furthermore arranged above the drain connection zone 12 in the vertical direction.

Situated between the source connection zone 9 and the drift zone 11 is a channel zone 10, which is heavily p-doped ($p^+$) complementarily with respect to these two zones and produces a pn junction in order to make the trench transistor normally off. The channel zone 10 is short-circuited by the electrical contact 8 of the source metallization 7 with the source connection zone 9 in order to avoid the switching on of a parasitic bipolar transistor.

A first control electrode (gate electrode) 13 composed of polysilicon, for example, is arranged adjacent to the channel zone 10 in the trenches 2, 2', 2", the first control electrode being able to be connected to a first (positive) control potential in order to produce a conductive channel in the channel zone 10 when the supply voltage is applied to the source and drain electrodes, the conductive channel enabling a current flow between the source and drain electrodes. The gate electrode 13 is electrically insulated from the semiconductor body 3, and in particular from the channel zone 10, by a gate insulation layer 14. A further insulation layer 15 serves for electrically insulating the gate electrode 13 from the source metallization 7. The lower edge 18 of the gate electrode 13 is situated approximately at the level of the pn junction 19.

A second control electrode (field electrode) 16 composed of polysilicon, for example, is arranged below the gate electrode 13 in the vertical direction in the trenches 2, 2', 2", the second control electrode being able to be connected to a second control potential. The field electrode 16 is insulated from the semiconductor body 3 by the field insulation layer 17. In this case, the field insulation layer 17 is made thinner than the gate insulation layer 14. An intergate insulation layer 20 serves for electrically insulating the gate electrode 13 from the field electrode 16.

The trenches 2, 2', 2" extend from the cell array 5 right into the edge structure 6 of the trench transistor 1. In the trenches 2, 2', 2", both the gate electrodes 13 and the field electrodes are formed in plate-type fashion and extend right into the edge structure 6.

As can be gathered from FIG. 1, the source metallization 7 extends from the cell array 5 right into the edge structure 6, for which purpose the source metallization 7 undergoes transition via a connecting section 31 into an edge structure section 32 of the source metallization 7.

As can be gathered from FIG. 2B, a lateral sectional view in accordance with the sectional line II-II from FIG. 1, the source metallization 7 or the edge structure section 32 thereof contact-connects the field electrodes 16 situated in the trenches 2 and 2" in the edge structure 6, such that the field electrodes are connected or can be connected to the source potential. Each of the field electrodes 16 is contact-connected by using an electrical contact 21 of the source metallization 7 that is formed in a contact hole. For this purpose, at the contact location the gate electrode 13 was not formed in the trenches 2 and 2".

As can furthermore be gathered from FIG. 1, a gate metallization 22 is arranged in the edge structure 6 of the trench transistor 1. In this case, the gate metallization 22 includes two contact series, namely a first contact series 25 for contact-connecting the gate electrodes 13 in the trenches 2, 2', 2" and a second contact series 26 for contact-connecting the field electrode 16 in the trench 2'. The gate electrodes 13 are contact-connected by using contacts 23 of the gate metallization 22 that are formed in contact holes. As can be gathered from FIG. 2C, a lateral sectional view in accordance with the sectional line III-III from FIG. 1, the field electrode 16 in the trench 2' is contact-connected by using an electrical contact 24 of the gate metallization 22 that is formed in a contact hole. For this purpose, at the contact location the gate electrode 13 was not formed in the trench 2'.

By virtue of the different contact-connection of the field electrodes 16 in the trenches 2 and 2", on the one hand, and in the trench 2', on the other hand, the field electrodes 16 in the trenches 2 and 2" can be connected to the source potential and the field electrode 16 in the trench 2' can be connected to the gate potential. In this respect, a sequence of field electrodes 16 which are connected or can be connected alternately to source potential and gate potential is produced in the lateral direction (x) perpendicular to the extension direction (y) of the trenches.

Figure 3A:
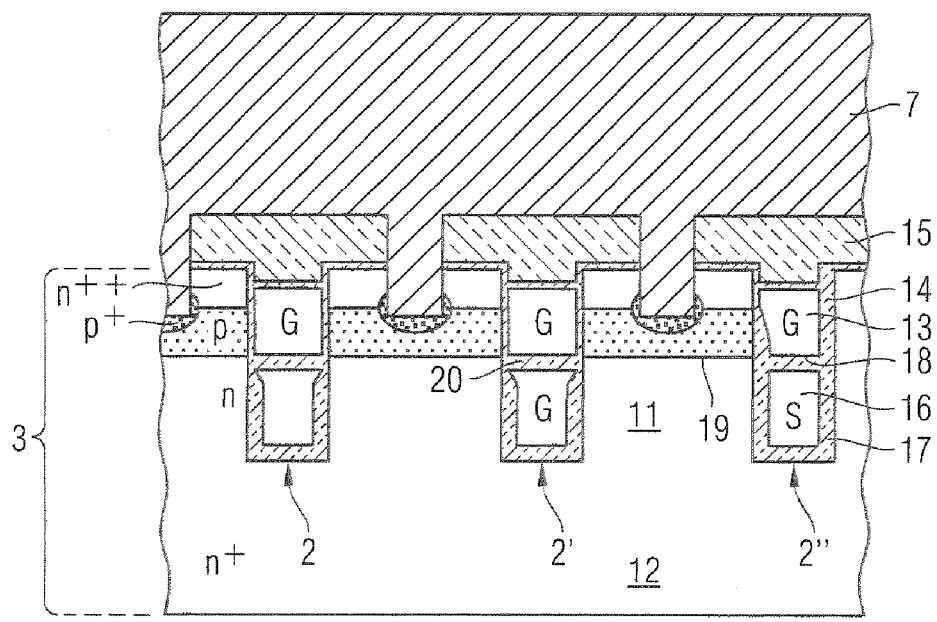
FIG. 3 illustrates schematic lateral sectional illustrations in accordance with the sectional lines I-I, II-II and III-III from FIG. 1 of a second embodiment of the trench transistor.
Figure 3A:
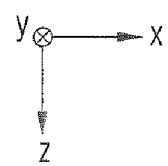
Figure 3B:
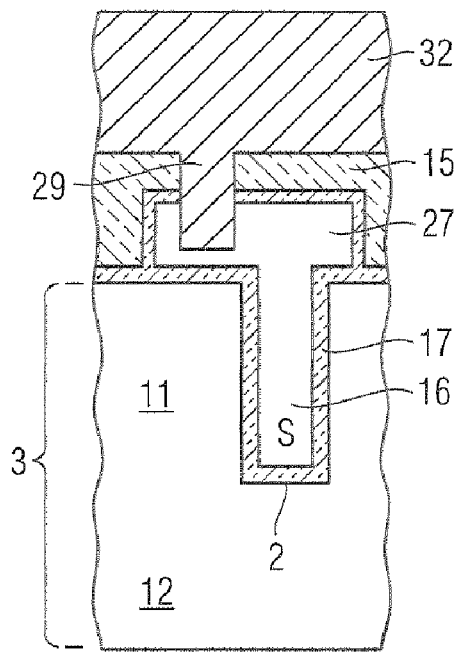
Figure 3C:
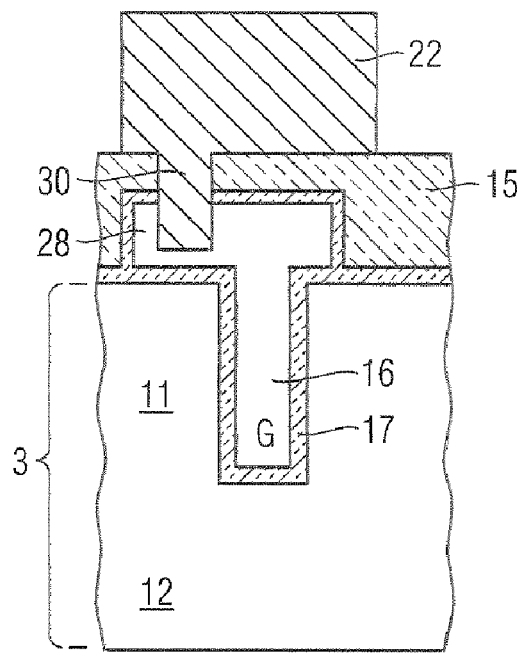

Reference will now be made to FIGS. 3A, 3B, 3C, which illustrate lateral sectional illustrations in accordance with the sectional lines I-I, II-II and III-III from FIG. 1 of a second embodiment of the trench transistor according to the invention. In order to avoid unnecessary repetition, only the differences with respect to the embodiment of FIGS. 2A, 2B, 2C are explained and reference is otherwise made to the explanations given there.

Accordingly, the field electrodes 16 in the trenches 2 and 2" and in the trench 2' are not contact-connected within the trenches, but rather outside the trenches. As can be gathered from FIG. 3B, for this purpose a contact section 27 of the field electrode 16 is led out from the trench 2 and, for its part, is contact-connected by an electrical contact 29 of the edge structure section 32 of the source metallization 7. As can be gathered from FIG. 3C, for this purpose furthermore a contact section 28 of the field electrode 16 is led out from the trench 2' and, for its part, is contact-connected by an electrical contact 30 of the gate metallization 22.

The exemplary embodiments serve merely for illustrating the invention. In particular, the trench transistor is not restricted to transistors including a rear-side drain connection zone (drain electrode), but rather can likewise be applied to drain-up transistors, in which the drain region is led to the surface of the semiconductor body via a highly doped region (sinker contact). Furthermore, both n- and p-channel transistors are possible. Furthermore, the field electrode can also be arranged partly alongside the gate electrode or be surrounded by the latter.

In the trench transistor it is advantageously possible, by changing the layout of a contact hole mask for forming contact holes for contact-connecting the field electrodes, to obtain a desired contact-connection of the field electrodes for setting a desired on resistance and a parasitic capacitance between gate electrode and drain electrode.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit having a trench transistor and comprising:
    a semiconductor body, subdivided into a cell array region having at least one cell array and an edge structure framing the cell array, the semiconductor body being provided with at least one doped source connection zone and at least one doped drain connection zone in the cell array;
    wherein the source connection zone is supplied by source potential through a first connection electrode and the drain connection zone is supplied by drain potential through a second connection electrode;
    a plurality of active trenches formed in the semiconductor body;
    a plurality of first control electrodes formed in the active trenches, wherein each first control electrode of the plurality of first control electrodes is formed in the active trench designated for this first control electrode, and each of the plurality of first control electrodes being insulated from the semiconductor body by a first insulation layer in the trench designated for this first control electrode;
    a plurality of second control electrodes, each second control electrode of the plurality of second control electrodes is arranged adjacent to and separated from a corresponding first control electrode located in the active trench designated for the first control electrode, the plurality of second control electrodes being field electrodes and each of the plurality of second control electrodes is insulated by a second insulation layer from the semiconductor body and the first control electrode located in the same active trench, the active trenches and the plurality of first control electrodes and the plurality of second control electrodes formed therein extending in a first lateral direction,
    wherein the plurality of first control electrodes are a plurality of gate electrodes and electrically connected to a first electrical line being supplied by gate potential; and
    wherein in the edge structure a selectable number of the plurality of second control electrodes are electrically connected to the first connection electrode through first connection means and a selectable number of the plurality of second control electrodes are electrically connected to a second electrical line connected to the plurality of first control electrodes through a second connection means,
    such that in the edge structure a part of the plurality of second control electrodes is electrically connected through the first connection electrode to the source potential and a part of the plurality of second control electrodes is contacted through the plurality of first control electrodes to the gate potential.

2. The integrated circuit of claim 1, wherein the plurality of second control electrodes are contact-connected by the first connection electrode and by the first connection means in a second lateral direction perpendicular to the extension direction of active trenches with a selectable contact-connection scheme that is repeated substantially periodically in this direction.

3. The integrated circuit of claim 1, wherein the plurality of second control electrodes are contact-connected by in the edge structure by the connection means to the first electrical line and by the second connection means to the second electrical line in a second lateral direction perpendicular to the lateral extension direction of trenches with a selectable contact-connection scheme that is repeated substantially periodically in this direction.

4. The integrated circuit of claim 1, wherein the second electrical line is electrically conductively connected to the first connection electrode.

5. The integrated circuit of claim 1, wherein the first electrical line in the edge structure comprises a third connection means for electrically connecting the first electrical line and the plurality of first control electrodes.

6. The integrated circuit of claim 1, wherein the first connection means for electrically connecting one or more of the plurality of second control electrodes to the first electrical line comprise an electrical contact formed in a contact hole.

7. The integrated circuit of claim 1, wherein the second connection means for electrically connecting one or more of the plurality of second control electrodes to the second electrical line comprises an electrical contact formed in a contact hole.

8. The integrated circuit of claim 1, wherein the cell array region comprises a plurality of cell arrays which are separated from each other by the edge structure.

9. The integrated circuit of claim 1, wherein the active trenches and the plurality of first control electrodes and the plurality of second control electrodes extend into the edge structure.

10. The integrated circuit of claim 1, wherein the plurality of first control electrodes are electrically connected in the edge structure to the first electrical line formed therein.

* * * * *